United States Patent
Kim et al.

(10) Patent No.: US 11,508,762 B2
(45) Date of Patent: Nov. 22, 2022

(54) SUBSTRATE PROCESSING APPARATUS AND METHOD OF MANUFACTURING DISPLAY PANEL USING THE SAME

(71) Applicant: Samsung Display Co., Ltd., Yongin-Si (KR)

(72) Inventors: Youngdae Kim, Seoul (KR); Jinseock Kim, Seongnam-si (KR); Jonghee Park, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 2 days.

(21) Appl. No.: 17/159,518

(22) Filed: Jan. 27, 2021

(65) Prior Publication Data

US 2021/0327926 A1 Oct. 21, 2021

(30) Foreign Application Priority Data

Apr. 20, 2020 (KR) .................. 10-2020-0047209

(51) Int. Cl.
*H01L 27/12* (2006.01)
*H01L 21/67* (2006.01)
*H01L 21/3213* (2006.01)
*H01L 21/677* (2006.01)

(52) U.S. Cl.
CPC .... *H01L 27/1266* (2013.01); *H01L 21/32134* (2013.01); *H01L 21/6708* (2013.01); *H01L 21/67075* (2013.01); *H01L 21/6776* (2013.01); *H01L 21/67173* (2013.01); *H01L 21/67253* (2013.01); *H01L 27/1225* (2013.01);

(Continued)

(58) Field of Classification Search
CPC ............. H01L 27/1266; H01L 27/1288; H01L 21/6776; H01L 27/124; H01L 27/1259; H01L 21/6708; H01L 27/1225; H01L 21/67075; H01L 21/32134; H01L 21/67173; H01L 21/67253; H01L 21/67706

See application file for complete search history.

(56) References Cited

U.S. PATENT DOCUMENTS 6,455,101 B1 * 9/2002 Sasaki .................. G11B 5/8408
427/372.2
7,156,948 B2 1/2007 Lin et al.
(Continued)

FOREIGN PATENT DOCUMENTS

JP 2004172427 * 6/2004
JP 2006278409 A 10/2006
(Continued)

*Primary Examiner* — Ahmed N Sefer

(74) *Attorney, Agent, or Firm* — Cantor Colburn LLP

(57) ABSTRACT

A substrate processing apparatus includes a first process chamber in which a target substrate is processed, a first tank connected to the first process chamber to supply a first chemical to the first process chamber, a second process chamber in which the target substrate is processed, and a second tank connected to the second process chamber to supply a second chemical to the second process chamber. A metal ion contained in the first chemical supplied to the first process chamber has an ion concentration greater than an ion concentration of the metal ion contained in the second chemical supplied to the second process chamber.

20 Claims, 10 Drawing Sheets

(52) U.S. Cl.
CPC ........ *H01L 27/1288* (2013.01); *H01L 27/124* (2013.01); *H01L 27/1259* (2013.01)

(56) References Cited

U.S. PATENT DOCUMENTS

| | | | | |
|---|---|---|---|---|
| 2003/0216045 | A1* | 11/2003 | Wang | C09G 1/04 |
| | | | | 438/689 |
| 2010/0307533 | A1* | 12/2010 | Sato | H01L 21/67057 |
| | | | | 134/99.1 |
| 2014/0231010 | A1* | 8/2014 | Park | H01L 21/6708 |
| | | | | 222/135 |
| 2016/0293447 | A1* | 10/2016 | Iwasaki | H01L 21/6708 |
| 2019/0198356 | A1* | 6/2019 | Higuchi | H01L 21/67017 |
| 2020/0185221 | A1* | 6/2020 | Yoshimizu | H01L 29/40117 |

FOREIGN PATENT DOCUMENTS

| | | | |
|---|---|---|---|
| KR | 20150041378 | * | 10/2013 |
| KR | 1020160084546 A | | 7/2016 |

* cited by examiner

SUBSTRATE PROCESSING APPARATUS AND METHOD OF MANUFACTURING DISPLAY PANEL USING THE SAME

This application claims priority to Korean Patent Application No. 10-2020-0047209, filed on Apr. 20, 2020, and all the benefits accruing therefrom under 35 U.S.C. § 119, the content of which in its entirety is herein incorporated by reference.

BACKGROUND

1. Field

The disclosure herein relates to a substrate processing apparatus and a method of manufacturing a display panel using the substrate processing apparatus. More particularly, the disclosure herein relates to a substrate processing apparatus with improved process reliability and a method of manufacturing a display panel using the substrate processing apparatus.

2. Description of the Related Art

In recent years, a flat panel display ("FPD") having various desired characteristics, such as a large display area, thinness and lightweightness, has been widely used as a display device. As the flat panel display, a liquid crystal display device and an organic light emitting display device have been used.

SUMMARY

A flat panel display typically includes a plurality of conductive patterns, and the conductive patterns may be provided by etching metal such as silver. However, in a wet etching process using an etchant, as a metal ion concentration in the etchant increases, an accumulated process number of the etchant may decrease, and metal ions may be reduced and precipitated to cause a defect such as a short circuit in the display device. Thus, process improvement is desired to prevent such a defect.

The disclosure provides a substrate processing apparatus with improved process reliability by preventing a defect generated in a target substrate.

The disclosure also proves a method of manufacturing a display panel with improved reliability by preventing a defect generated in a metal line, etc.

An embodiment of the invention provides a substrate processing apparatus including: a first process chamber in which a target substrate is processed; a first tank connected to the first process chamber to supply a first chemical to the first process chamber; a second process chamber in which the target substrate is processed; and a second tank connected to the second process chamber to supply a second chemical to the second process chamber. In such an embodiment, a metal ion contained in the first chemical supplied to the first process chamber has an ion concentration greater than an ion concentration of the metal ion contained in the second chemical supplied to the second process chamber.

In an embodiment, the substrate processing apparatus may further include a transfer part which transfers the target substrate, and the target substrate may be transferred in a direction from the first process chamber to the second process chamber by the transfer part.

In an embodiment, the substrate processing apparatus may further include: a third process chamber in which the target substrate is processed; and a third tank connected to the third process chamber to supply a third chemical to the third process chamber, and the metal ion contained in the third chemical supplied to the third process chamber may have an ion concentration less than the ion concentration of the metal ion contained in the second chemical supplied to the second process chamber.

In an embodiment, the target substrate may be processed in the first process chamber and then transferred to the second process chamber, and processed in the second process chamber and then transferred to the third process chamber.

In an embodiment, the substrate processing apparatus may further include a concentration meter connected to the third tank to measure a metal ion concentration of the third chemical contained in the third tank.

In an embodiment, the third chemical may not include the metal ion.

In an embodiment, the substrate processing apparatus may further include a standby tank which supplies a new chemical to each of the first tank, the second tank, and the third tank.

In an embodiment, the new chemical may not include the metal ion.

In an embodiment, the substrate processing apparatus may further include a drain pipe connected to each of the first tank, the second tank, and the third tank to transfer the first to third chemicals from the first tank, the second tank, and the third tank, respectively.

In an embodiment, the drain pipe may include: a first drain pipe which transfers the third chemical from the third tank to the second tank; a second drain pipe which transfers the second chemical from the second tank to the first tank; and a third drain pipe which discharges the first chemical from the first tank.

In an embodiment, each of the first chemical and the second chemical may include an etchant for etching a metal part in the target substrate.

In an embodiment, the metal part may include a first metal oxide layer, a metal layer, and a second metal oxide layer, which are sequentially laminated one on another, and the metal layer may include silver (Ag).

In an embodiment, the metal ion contained in each of the first chemical and the second chemical may be a silver (Ag) ion.

In an embodiment of the invention, the substrate processing apparatus may further include: a first supply pipe which supplies the first chemical from the first tank to the first process chamber; a first discharge pipe which discharges the first chemical to the first tank after the target substrate is processed in the first process chamber; a second supply pipe which supplies the second chemical from the second tank to the second process chamber; and a second discharge pipe which discharges the second chemical to the second tank after the target substrate is processed in the second process chamber.

In an embodiment, the target substrate may be a display panel in a display device.

In an embodiment of the invention, a display panel manufacturing apparatus for providing a plurality of pads in a display panel includes: a first process chamber in which the display panel is processed; a first tank connected to the first process chamber to supply a first chemical to the first process chamber; a second process chamber in which the display panel processed in the first process chamber is further processed; and a second tank connected to the second process chamber to supply a second chemical to the second process chamber. In such an embodiment, a metal ion contained in the first chemical supplied to the first process chamber has an ion concentration greater than an ion concentration of the metal ion contained in the second chemical supplied to the second process chamber.

In an embodiment, the first process chamber and the second tank may be spaced apart from each other, and the second process chamber and the first tank may be spaced apart from each other.

In an embodiment of the invention, a method of manufacturing a display panel includes: preparing a pad part including a first metal layer; providing an electrode part including a second metal layer on the pad part; and etching the electrode part. In such an embodiment, the etching the electrode part includes: etching the electrode part in a first process chamber by using a first chemical; etching the electrode part in a second process chamber by using a second chemical after the etching the electrode part in the first process chamber; and etching the electrode part in a third process chamber by using a third chemical after the etching the electrode part in the second process chamber. In such an embodiment, a metal ion contained in the second chemical has an ion concentration less than an ion concentration of the metal ion contained in the first chemical, and metal ion contained in the third chemical has an ion concentration less than the ion concentration of the metal ion contained in the second chemical.

In an embodiment, the first metal layer may include aluminum (Al), and the second metal layer may include silver (Ag).

In an embodiment, a metal ion contained in the first to third chemicals may be a silver (Ag) ion.

BRIEF DESCRIPTION OF THE DRAWINGS

The above and other features of the invention will become more apparent by describing in further detail embodiments thereof with reference to the accompanying drawings, in which.

DETAILED DESCRIPTION

Figure 1:
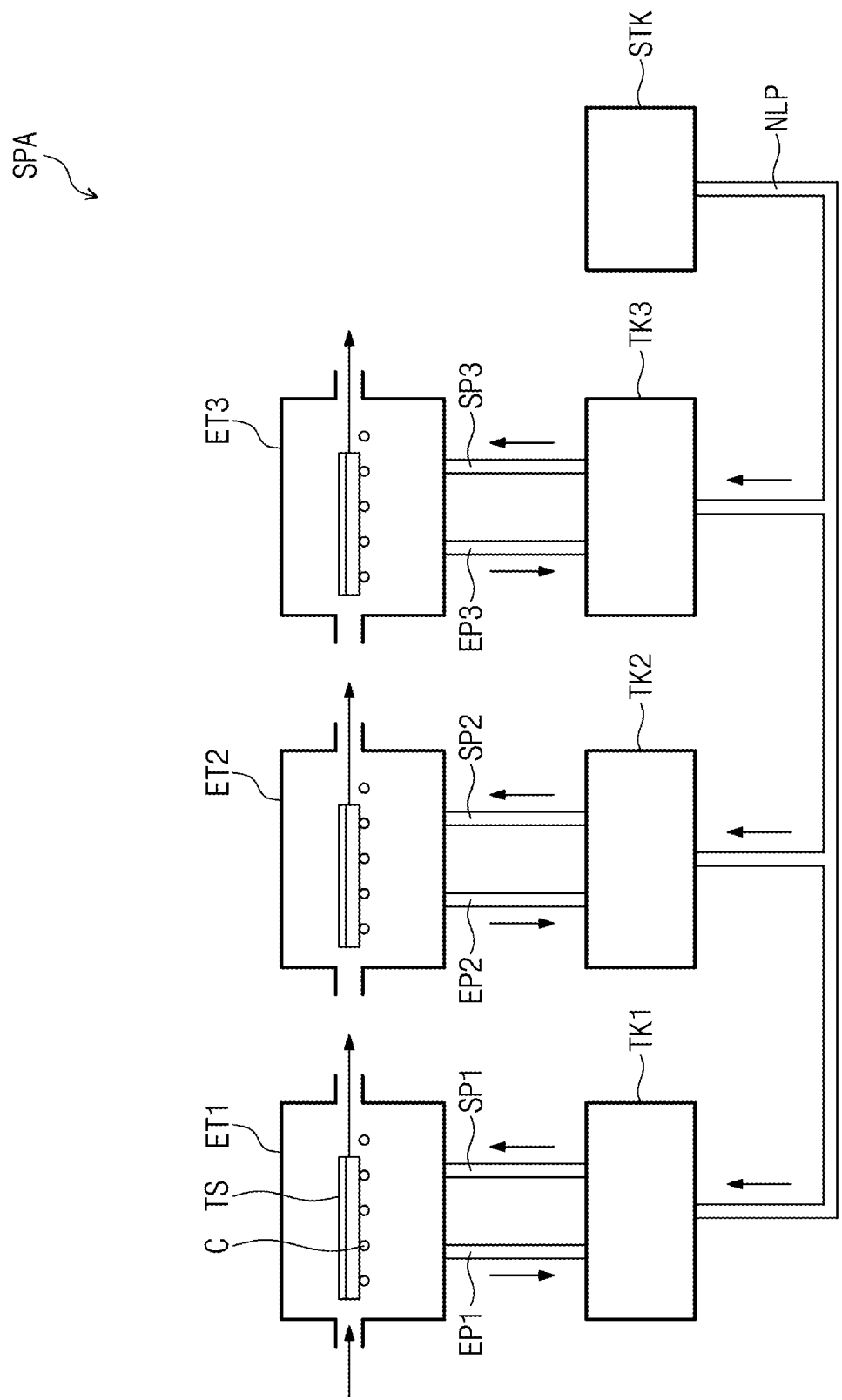
FIG. 1 is a schematic block diagram illustrating a substrate processing apparatus according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a region, layer, or portion is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
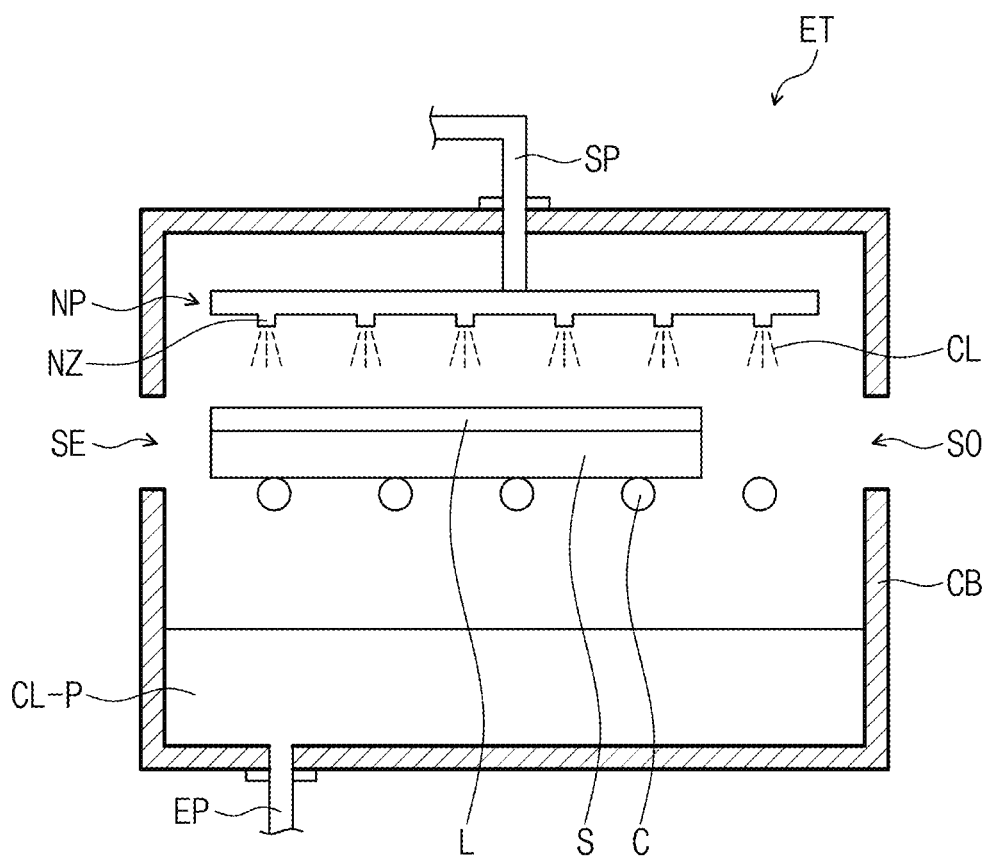
FIG. 2 is a schematic cross-sectional view illustrating a partial configuration of the substrate processing apparatus according to an embodiment of the invention.
Figure 3:
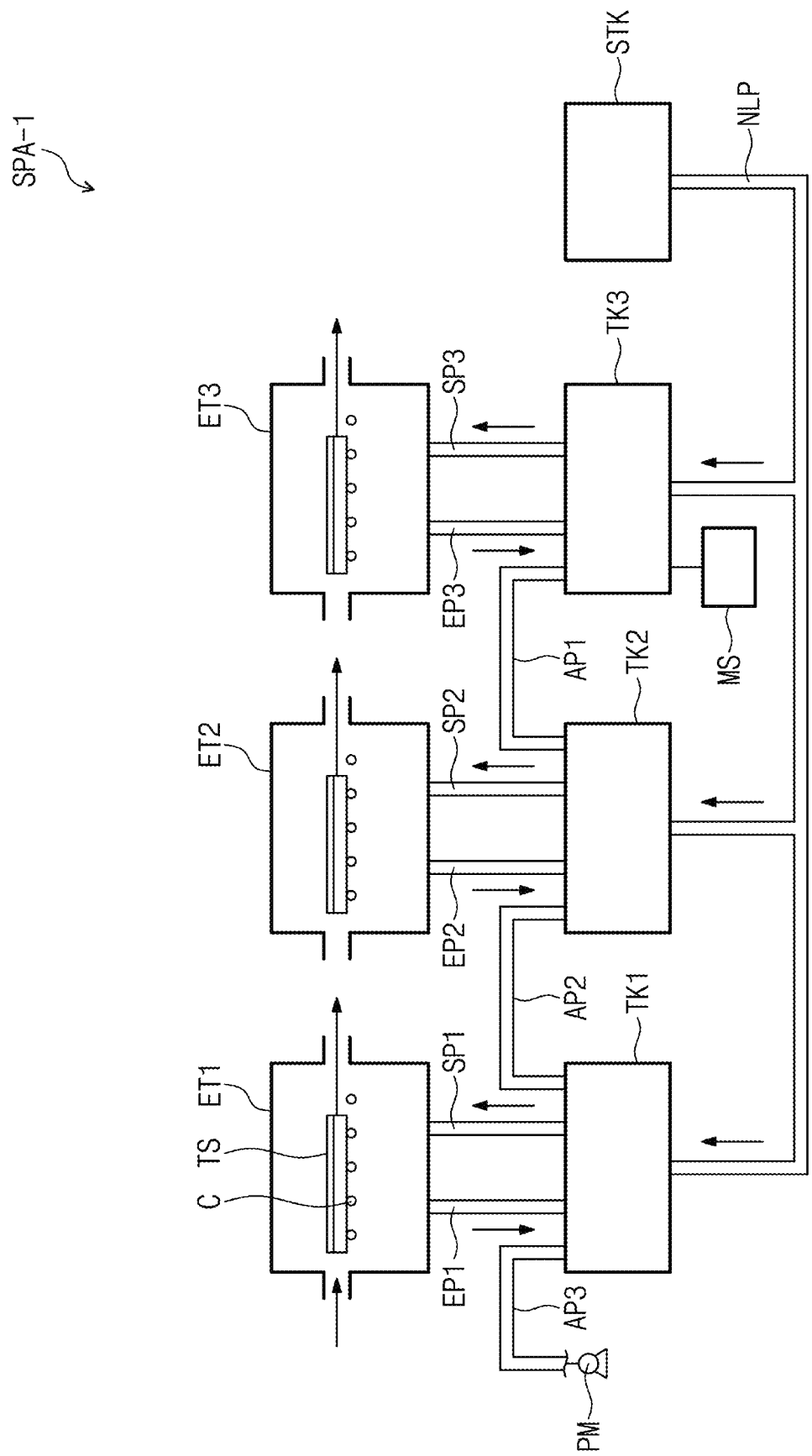
FIG. 3 is a schematic block diagram illustrating a substrate processing apparatus according to an alternative embodiment of the invention.

FIG. 1 is a schematic block diagram illustrating a substrate processing apparatus according to an embodiment of the invention. FIG. 2 is a schematic cross-sectional view illustrating a partial configuration of the substrate processing apparatus according to an embodiment of the invention. FIG. 3 is a schematic block diagram illustrating a substrate processing apparatus according to an alternative embodiment of the invention.

Referring to FIG. 1, an embodiment of a substrate processing apparatus SPA includes a plurality of process chambers ET1, ET2, and ET3 for processing a target substrate TS and a plurality of tanks TK1, TK2, and TK3 connected to the plurality of process chambers ET1, ET2, and ET3, respectively, to supply a chemical for processing the target substrate TS. In an embodiment, the target substrate TS processed by the substrate processing apparatus SPA may be a display panel DP (refer to FIG. 5) in a display device DD (refer to FIG. 5). In such an embodiment, at least some metal signal lines and metal pads in the display panel DP may be etched by the substrate processing apparatus SPA.

The plurality of process chambers ET1, ET2, and ET3 may include a first process chamber ET1, a second process chamber ET2, and a third process chamber ET3. The target substrate TS may be processed while sequentially moving along the first process chamber ET1, the second process chamber ET2, and the third process chamber ET3. The target substrate TS may be processed in the first process chamber ET1 and then transferred to the second process chamber ET2, and processed in the second process chamber ET2 and then transferred to the third process chamber ET3. Each of the first process chamber ET1, the second process chamber ET2, and the third process chamber ET3 may include a transfer part C for transferring the target substrate TS. Although not shown, each of the first process chamber ET1, the second process chamber ET2, and the third process chamber ET3 may further include a loading part for loading the target substrate TS and an unloading part for unloading the target substrate TS. In an embodiment, a cleaning chamber connected to each of the first process chamber ET1, the second process chamber ET2, and the third process chamber ET3 may be further provided to clean the target substrate TS having undergone a process.

Each of the first process chamber ET1, the second process chamber ET2, and the third process chamber ET3 may be an etching device for etching a metal line in the target substrate TS. Each of the first process chamber ET1, the second process chamber ET2, and the third process chamber ET3 may provide a predetermined space for etching the metal line provided on the target substrate TS. An etchant for etching the metal line in the target substrate TS may be supplied to each of the first process chamber ET1, the second process chamber ET2, and the third process chamber ET3.

In an embodiment, the plurality of process chambers ET1, ET2, and ET3 may include three process chambers which are consecutively disposed, as shown in FIG. 1, the embodiment of the invention is not limited thereto. In one alternative embodiment, for example, two process chambers or four or more process chambers may be consecutively disposed.

The first process chamber ET1, the second process chamber ET2, and the third process chamber ET3 may be connected to a first tank TK1, a second tank TK2, and a third tank TK3, which are corresponding thereto, respectively. The plurality of tanks TK1, TK2, and TK3 may be connected to the plurality of process chambers ET1, ET2, and ET3, respectively, and a non-corresponding tank may not be connected to the process chambers. In an embodiment, the first tank TK1 may be connected to the first process chamber ET1, and each of the second tank TK2 and the third tank TK3 may be spaced apart from the first process chamber ET1 without being connected thereto. The second tank TK2 may be connected to the second process chamber ET2, and each of the first tank TK1 and the third tank TK3 may be spaced apart from the second process chamber ET2 without being connected thereto. The third tank TK3 may be connected to the third process chamber ET3, and each of the first tank TK1 and the second tank TK2 may be spaced apart from the third process chamber ET3 without being connected thereto.

The plurality of process chambers ET1, ET2, and ET3 may be connected to the plurality of tanks TK1, TK2, and TK3, respectively, through chemical supply pipes SP1, SP2, and SP3 and chemical discharge pipes EP1, EP2, and EP3. In an embodiment, the first process chamber ET1 may be connected to the first tank TK1 through a first supply pipe SP1 and a first discharge pipe EP1. The second process chamber ET2 may be connected to the second tank TK2 through a second supply pipe SP2 and a second discharge pipe EP2. The third process chamber ET3 may be connected to the third tank TK3 through a third supply pipe SP3 and a third discharge pipe EP3. The plurality of process chambers ET1, ET2, and ET3 may receive the chemical for processing the target substrate TS through the chemical supply pipes SP1, SP2, and SP3 from the plurality of tanks TK1, TK2, and TK3, respectively, and circulate the used chemical to the plurality of tanks TK1, TK2, and TK3 through the chemical discharge pipes EP1, EP2, and EP3 after the target substrate TS is processed.

Referring to FIG. 2 in conjunction with FIG. 1, in an embodiment, each process chamber ET of the plurality of process chambers ET1, ET2, and ET3 may include an outer wall CB for defining a predetermined space, an inlet SE that is an inlet passage of the target substrate TS may be defined in one sidewall of the outer wall CB, and an outlet SO that is an outlet passage of the target substrate TS may be defined in another sidewall (or an opposing sidewall), which faces the one sidewall, of the outer wall CB. In such an embodiment, as an introduction hole is defined in an upper wall of the process chamber ET, a chemical CL is supplied to a chemical injection part NP. In such an embodiment, a discharge hole is defined in a lower wall of the process chamber ET, such that a chemical CL-P that is used and supplied from the chemical injection part NP on the target substrate TS may be discharged to the outside. In an embodiment, the target substrate TS in which a metal part L is provided on a base layer S may be loaded into the process chamber ET through the inlet SE defined in the one sidewall of the process chamber ET, seated on the transfer part C, and transferred in a predetermined direction as the transfer part C is driven.

The chemical injection part NP may be disposed in the process chamber ET and include a plurality of injection nozzles NZ for injecting the chemical CL onto the target substrate TS. The injection nozzle NZ may be connected to the chemical supply pipe SP through the introduction hole. The etching process may be performed such that the chemical CL is supplied to the chemical injection part NP through the chemical supply pipe SP and then the injection nozzles NZ of the chemical injection part NP inject the chemical CL onto the target substrate TS.

In an embodiment, the chemical CL may include an etchant for etching metal. Metal etched by the etchant contained in the chemical may be silver (Ag). The chemical CL may etch a metal layer including or formed of silver and supplied on the target substrate TS to provide an electrode and a line. The etchant contained in the chemical CL may include an oxidizing agent and deionized water.

The chemical CL-P that is injected onto the target substrate TS from the chemical injection part NP and used for the etching process may be primarily collected in a chemical bath defined in a lower portion of the process chamber ET. The chemical bath may be connected to the chemical discharge pipe EP through the discharge hole, and the chemical CL-P collected in the chemical bath may be circulated to the corresponding tank connected to the process chamber ET among the plurality of tanks TK1, TK2, and TK3 through the chemical discharge pipe EP.

Referring back to FIG. 1, the first process chamber ET1 receives a first chemical from the first tank TK1, and the second process chamber ET2 receives a second chemical from the second tank TK2. The first process chamber ET1 may receive the first chemical from the first tank TK1 through the first supply pipe SP1, and the second process chamber ET2 may receive the second chemical from the second tank TK2 through the second supply pipe SP2. In an embodiment, each of the first chemical and the second chemical contains a metal ion, and the first chemical has a metal ion concentration greater than that of the second chemical. In an embodiment, the metal ion contained in each of the first chemical and the second chemical may be a metal ion contained in the metal layer that is etched by the etchant contained in the chemicals. The metal ion contained in each of the first chemical and the second chemical may be a silver (Ag) ion.

The third process chamber ET3 may receive a third chemical from the third tank TK3. The third process chamber ET3 may receive a third chemical from the third tank TK3 through the third supply pipe SP3. In an embodiment, the third chemical contains a metal ion, and the first chemical has a metal ion concentration greater than that of each of the first chemical and the second chemical. The metal ion concentration of the third chemical may be about 0. That is, the third chemical may not include the metal ion.

In an embodiment, the substrate processing apparatus may include the plurality of process chambers, and in the plurality of process chambers in which the target substrate is processed, a metal ion concentration of the chemical used in a latter process chamber, in which the target substrate is processed later, may be adjusted to be less than that of the chemical used in a former process chamber in which the target substrate is processed earlier. In such an embodiment, the ion concentration of metal contained in the metal layer of the target substrate, which is etched through the etchant in the process chamber, may be adjusted to be less than the latter process chamber that is processed later. In such an embodiment of the substrate processing apparatus, each of the plurality of process chambers is connected to only the corresponding tank of the plurality of tanks and separated from other tanks, such that the metal ion concentration of the chemical supplied to each of the former process chamber and the latter process chamber may be adjusted differently from or independently of each other. Accordingly, in such an embodiment, a limitation generated when the metal ion is reduced due to the high metal ion concentration may be prevented. In such an embodiment, since a low metal ion concentration is maintained in the latter process chamber in which a further subsequent process is performed, a defect that may occur when other metal layers disposed below the target metal layer of the target substrate are oxidized due to the high metal ion concentration may be effectively prevented, and a defect due to short circuit between other metal layers as the metal ion is reduced and precipitated to provide metal particles may be prevented.

In an embodiment, as shown in FIG. 1, the substrate processing apparatus SPA may further include a standby tank STK that supplies a new chemical to each of the plurality of tanks TK1, TK2, and TK3. Herein, the new chemical may be an additional chemical provided from an outside. The standby tank STK may be connected to each of the plurality of tanks TK1, TK2, and TK3 through a new (or separate) chemical supply pipe NLP and supply the new chemical to each of the plurality of tanks TK1, TK2, and TK3. The new chemical may not include the metal ion contained in the metal layer of the target substrate TS. When the third process chamber ET3 supplies the third chemical from the third tank TK3, the third chemical may correspond to the new chemical supplied from the standby tank STK and may not include the metal ion.

Referring to FIG. 3, in an alternative embodiment, a substrate processing apparatus SPA-1 may further include drain pipes AN, AP2, and AP3 that are connected to a plurality of tanks TK1, TK2, and TK3, respectively. The drain pipes AN, AP2, and AP3 may be connected to the plurality of tanks TK1, TK2, and TK3, respectively, and may perform a function of transferring a chemical to another tank (e.g., an adjacent tank) or discharging a chemical to the outside. In an embodiment, the substrate processing apparatus SPA-1 may include: a first drain pipe AP1 connected to a third tank TK3 and which transfers a third chemical to a second tank TK2; a second drain pipe AP2 connected to the second tank TK2 and which transfers a second chemical to a first tank TK1; and a third drain pipe AP3 connected to the third tank TK3 and which transfers a first chemical to the outside.

In such an embodiment, a pump PM for discharging the chemical may be connected t to the third drain pipe AP3. In such an embodiment, where the substrate processing apparatus SPA-1 further includes the drain pipes AP1, AP2, and AP3, the second chemical supplied to a second process chamber ET2 may have a metal ion concentration that is effectively adjusted less than that of the first chemical supplied to a first process chamber ET1, and the third chemical supplied to a third process chamber ET3 may have a metal ion concentration that is effectively adjusted less than that of the second chemical supplied to the second process chamber ET2.

In an embodiment, as shown in FIG. 3, the substrate processing apparatus SPA-1 may further include a concentration meter MS that measures the metal ion concentration of the third chemical contained in the third tank TK3. The concentration meter MS may perform a function of adjusting a chemical to be automatically exchanged at an exchange period which is determined by measuring the metal ion concentration of the third chemical contained in the third tank TK3. The concentration meter MS may include an online monitoring system ("OMS"). In an embodiment, the substrate processing apparatus SPA-1 may measure the metal ion concentration of the third chemical contained in the third tank TK3, transfer the third chemical from the third tank TK3 to the second tank TK2 through the first drain pipe AP1 at the exchange period of the chemical, transfer the second chemical from the second tank TK2 to the first tank TK1 through the second drain pipe AP2, and discharge the first chemical from the first tank TK1 to the outside through the third drain pipe AP3.

Hereinafter, the display device including the display panel manufactured by the substrate processing device according to an embodiment will be described in detail.

Figure 4:
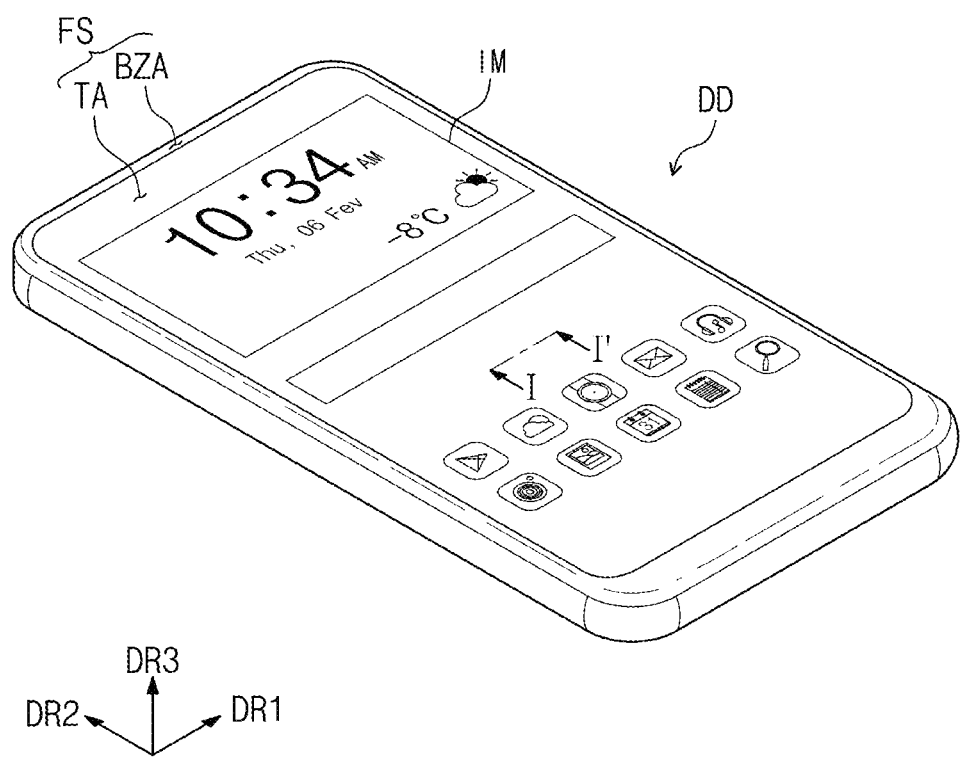
FIG. 4 is a perspective view illustrating a display device according to an embodiment of the invention.
Figure 5:
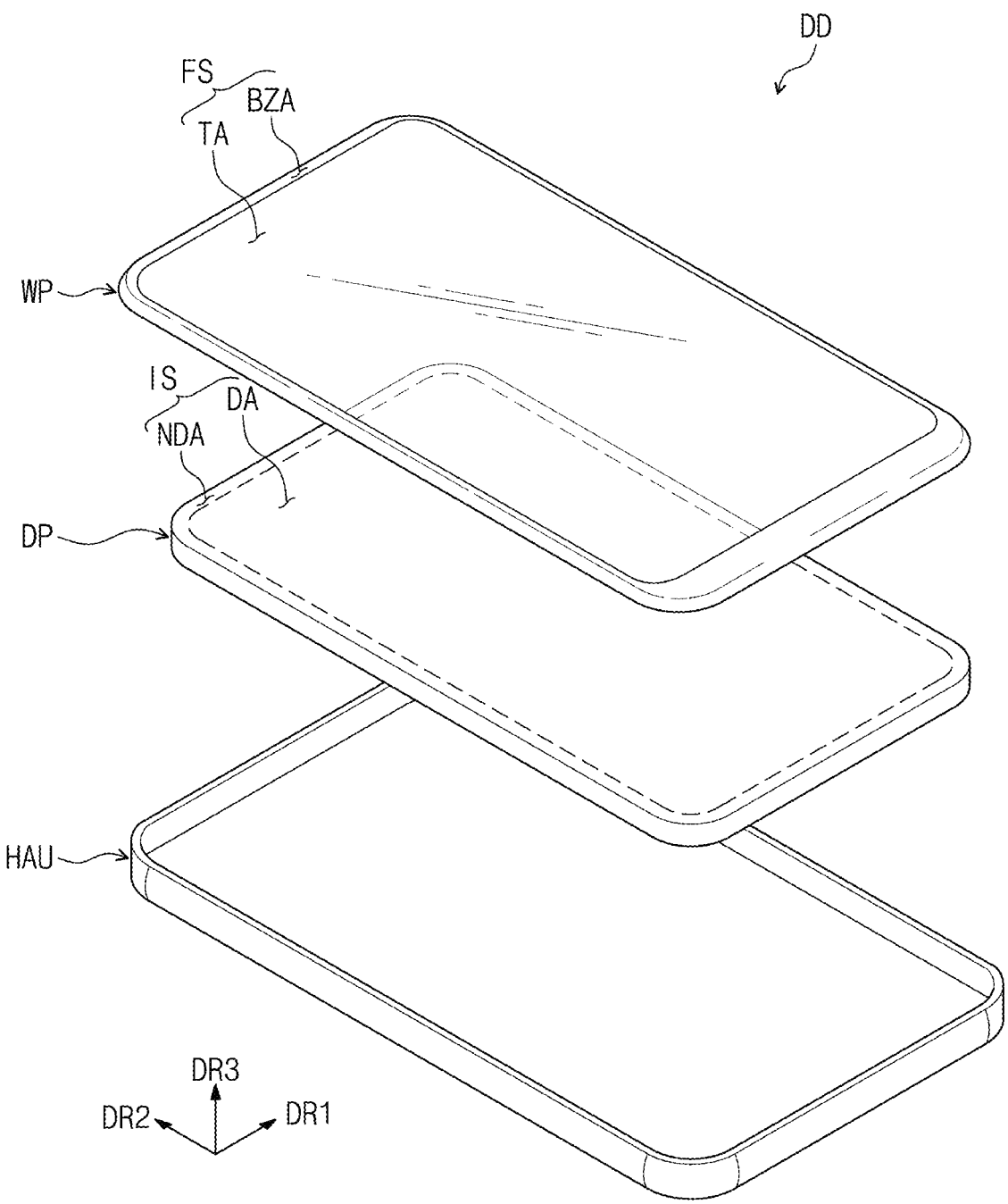
FIG. 5 is an exploded perspective view illustrating the display device according to an embodiment of the invention.

FIG. 4 is a perspective view illustrating the display device according to an embodiment of the invention. FIG. 5 is an exploded perspective view illustrating the display device according to an embodiment of the invention.

In an embodiment, the display device DD may be a large-sized electronic device such as a television, a monitor, or an outdoor advertisement board. In an alternative embodiment, the display device DD may be a small and medium-sized electronic device such as a personal computer, a notebook computer, a personal digital terminal, a navigation unit for a vehicle, a game console, a smartphone, a tablet computer, and a camera. The above-described devices are merely exemplary, and thus, the display device DD may be adopted or used for other electronic devices without departing from the teachings therein. In an embodiment, as shown in FIG. 4, the display device DD may be a smartphone.

In an embodiment, the display device DD may include a display panel DP and a housing HAU. The display panel DP generates an image IM through a display surface IS. In an embodiment, as shown in FIG. 4, the display surface IS is parallel to a surface defined by a first direction DR1 and a second direction crossing the first direction DR1. However, this is merely exemplary, and alternatively, the display surface IS of the display panel DP may have a curved shape, for example.

A normal direction of the display surface IS, i.e., a direction, in which the image IM is displayed, of a thickness direction of the display panel DP, is defined as a third direction DR3. A front surface (or top surface) and a rear surface (or bottom surface) of each of members are distinguished by the third direction DR3.

A display surface FS, on which the image IM is displayed, in the display device DD may correspond to each of a front surface of the display panel DP and a front surface FS of the window WP. Hereinafter, the display surface and the front surface of the display device and the front surface of the window WP are indicated by a same reference symbol. The image IM may include a still image as well as a moving image. Although not shown in the drawing, the display device DD may be a foldable display device including a folding area and a non-folding area, or a bendable or curved display device including at least one bendable or curved part.

In an embodiment, the housing HAU may accommodate the display panel DP. The housing HAU may cover the display panel DP while exposing a top surface, i.e., the display surface IS, of the display panel DP. The housing HAU may cover a side surface and a bottom surface of the display panel DP and expose the entire top surface. However, the embodiment of the invention is not limited thereto. In one alternative embodiment, for example, the housing HAU may cover a portion of the top surface in addition to the side surface and the bottom surface.

In an embodiment of the display device DD, the window WP may include an optically clear insulating material. The window WP may include a transmission area TA and a bezel area BZA. The front surface FS of the window WP including the transmission area TA and the bezel area BZA corresponds to the front surface FS of the display device DD. A user may view an image provided through the transmission area TA corresponding to the front surface FS of the display device DD.

In FIGS. 4 and 5, the transmission area TA has a rectangular shape with rounded corners when viewed from a front plan view or a plan view in the third direction DR3. However, this is merely exemplary. Alternatively, the transmission area TA may have one of various other shapes, and not limited to the shape of the transmission area TA shown in FIGS. 4 and 5.

The transmission area TA may be an optically clear or transparent area. The bezel area BZA may have a relatively lower light transmittance than that of the transmission area TA. The bezel area BZA may have a predetermined color. The bezel area BZA may be disposed adjacent to the transmission area TA to surround the transmission area TA. The bezel area BZA may define a shape of the transmission area TA. However, the embodiment of the invention is not limited thereto. In one alternative embodiment, for example, the bezel area BZA may be disposed adjacent to only one side of the transmission area TA, or a portion of the bezel area BZA may be omitted.

The display panel DP may be disposed below the window WP. Herein, a term "below" may represent an opposite direction of a direction in which the display panel DP provides an image.

In an embodiment, the display panel DP may be a component that substantially generates the image IM. The image IM generated from the display panel DP is displayed on the display surface IS thereof and viewed to a user at the outside through the transmission area TA. The display panel DP includes a display area DA and a non-display area NDA. The display area DA may be activated based on an electric signal. The non-display area NDA may be covered by the bezel area BZA. The non-display area NDA is disposed adjacent to the display area DA. The non-display area NDA may surround the display area DA.

In an embodiment of the display device, the display panel DP may be a light emitting display panel. In one embodiment, for example, the display panel DP may be a quantum dot light emitting display panel including a quantum dot light emitting element. However, the embodiment of the invention is not limited thereto.

Figure 6:
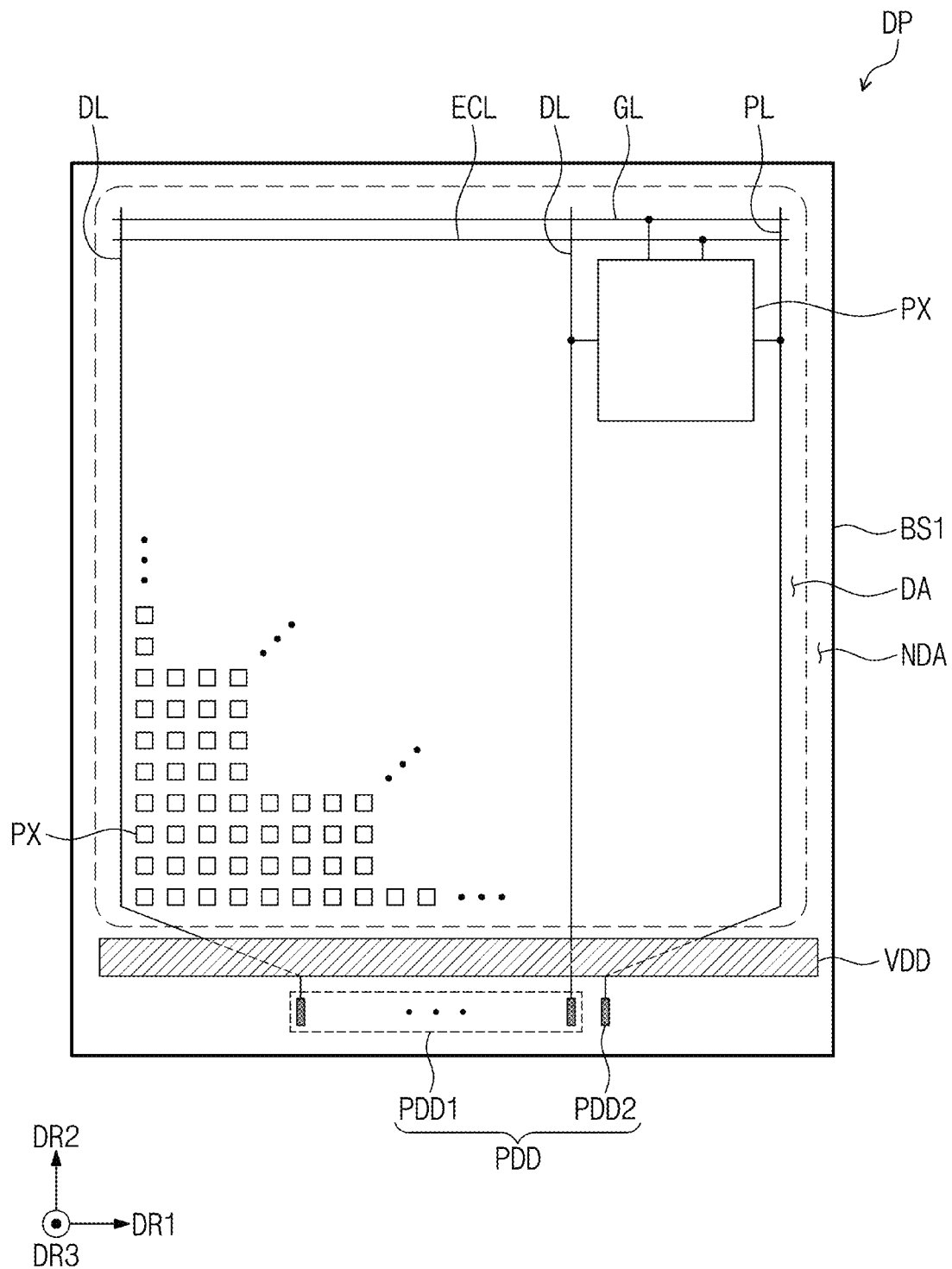
FIG. 6 is a plan view illustrating the display panel according to an embodiment of the invention.
Figure 7:
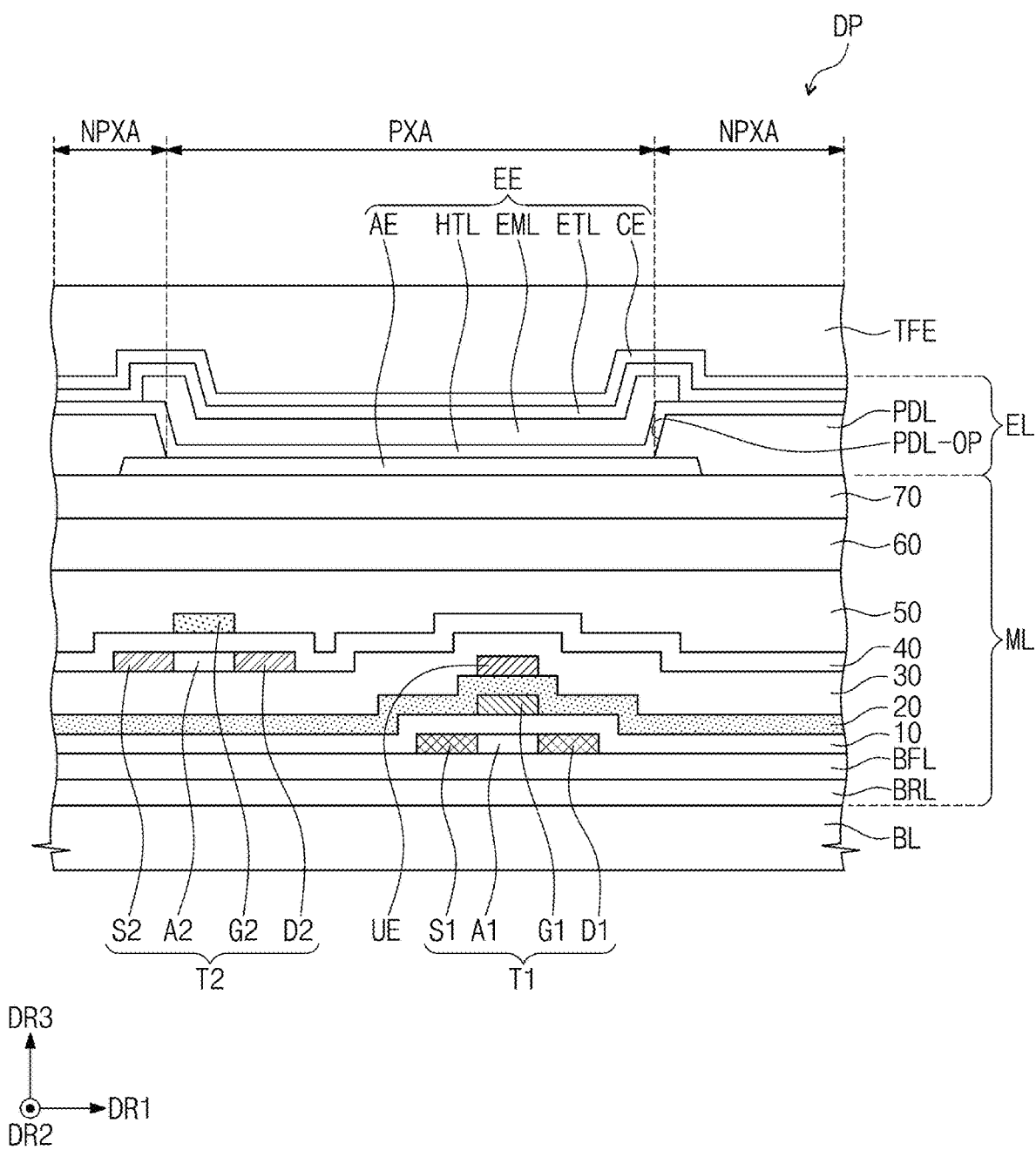
FIG. 7 is a cross-sectional view illustrating a display panel according to an embodiment of the invention.

FIG. 6 is a plan view illustrating the display panel according to an embodiment of the invention. FIG. 7 is a cross-sectional view illustrating the display panel according to an embodiment of the invention.

Referring to FIG. 6, an embodiment of the display panel DP may include a base substrate BS1, and a plurality of pixels PX, a plurality of signal lines GL, DL, PL, and ECL, and a plurality of display pads PDD, which are disposed on the base substrate BS1.

The display panel DP may have a display area DA, on which an image is displayed, and a non-display area NDA, on which a driving circuit or a driving line is disposed.

The signal lines GL, DL, PL, and ECL are connected to the pixels PX and transmit an electrical signal to the pixels PX. The signal lines may include a scan line GL, a data line DL, a power line PL, and a light emitting control line ECL, for example, as shown in FIG. 6. However, this is merely exemplary. In an embodiment, the signal lines GL, DL, PL, and ECL may further include an initialization voltage line, but the embodiment of the invention is not limited thereto. The pixels PX may be spaced apart from each other in the first direction DR1 and the second direction DR2 and arranged in a matrix form on a plane.

A power pattern VDD is disposed on the non-display area NDA. In an embodiment, the power pattern VDD is connected to a plurality of power lines PL. Thus, the display panel DP may provide a same first power signal to the plurality of pixels PX by including the power pattern VDD.

The display pads PDD may include a first pad PDD1 and a second pad PDD2. The first pad PDD1 may be provided in plural, and the plurality of first pads PDD1 may be connected to the data lines DL, respectively. The second pad PDD2 may be connected to the power pattern VDD and electrically connected to the power line PL. The display panel DP may provide electrical signals, which are provided from the outside through the display pads PDD, to the pixels PX. The display pads PDD may further include pads for receiving other electrical signals in addition to the first pad PDD1 and the second pad PDD2. However, the embodiment of the invention is not limited thereto.

Referring to FIG. 7, an embodiment of the display panel DP may be a light emitting display panel. FIG. 7 illustrates a cross-section corresponding to one of the plurality of pixels and a cross-section corresponding to two transistors T1 and T2 and a display element EE.

In an embodiment, as illustrated in FIG. 7, the display panel DP includes a base layer BL (or the base substrate BS1 shown in FIG. 6), a circuit element layer ML disposed on the base layer BL, a display element layer EL disposed on the circuit element layer ML, and an insulation layer TFE (hereinafter, referred to as an "upper insulation layer") disposed on the display element layer EL.

The base layer BL may include a synthetic resin layer. The base layer BL may be provided by providing a synthetic resin layer on a support substrate used for manufacturing the display panel DP, then providing a conductive layer and an insulation layer on the synthetic resin layer, and then removing the support substrate.

The circuit element layer ML includes at least one insulation layer and a circuit element. The circuit element includes a signal line and a driving circuit of a pixel. The circuit element layer ML may be provided through a process of providing an insulation layer, a semiconductor layer, and a conductive layer by coating or deposition and a process of patterning the insulation layer, the semiconductor layer, and the conductive layer by a photolithography process.

In an embodiment, as shown in FIG. 7, the circuit element layer ML includes a buffer layer BFL, a barrier layer BRL, and first to seventh insulation layers 10 to 70. Each of the buffer layer BFL, the barrier layer BRL, and the first to seventh insulation layers 10 to 70 may include one of an inorganic layer and an organic layer. In one embodiment, for example, each of the buffer layer BFL and the barrier layer BRL may include an inorganic layer. At least one of the fifth to seventh insulation layers 50 and 70 may include an organic layer.

FIG. 7 exemplarily illustrates an arrangement relationship of a first active A1, a second active A2, a first gate G1, a second gate G2, a first source S1, a second source S2, a first drain D1, and a second drain D2, which constitute the first and second transistors T1 and T2. In an embodiment, the first active A1 and the second active A2 may include materials different from each other. The first active A1 may include a polysilicon semiconductor, and the second active A2 may include a metal oxide semiconductor. Each of the first source S1 and the first drain D1, which has a doping concentration greater than that of the first active A1, has a function of an electrode. Each of the second source S2 and the second drain D2, which reduces the metal oxide semiconductor, has a function of an electrode.

In an embodiment of the invention, the first active A1 and the second active A2 may include a same semiconductor material as each other. Alternatively, a lamination structure of the circuit element layer ML may be further simplified. In an embodiment, the circuit element layer ML may further include a capacitor defined by an upper electrode UE and the first gate G1, as shown in FIG. 7.

The display element layer EL includes a pixel defining layer PDL and a display element EE. The display element EE may be an organic light emitting diode or a quantum dot light emitting diode. An anode AE is disposed on the seventh insulation layer 70. An opening PDL-OP is defined through the pixel defining layer PDL to expose at least a portion of the anode AE.

The opening PDL-OP of the pixel defining layer PDL may define a light emitting area PXA. A non-light emitting area NPXA may surround the light emitting area PXA.

A hole transport layer HTL and an electron transport layer ETL may be disposed on the light emitting area PXA and the non-light emitting area NPXA in common. The light emitting layer EML may have a pattern shape corresponding to the opening PDL-OP. A light emitting layer EML may be deposited in a different method in comparison with the hole transport layer HTL and the electron transport layer ETL, which may be film-type layers. The hole transport layer HTL and the electron transport layer ETL may be provided in the plurality of pixels in common by using an open mask. In an embodiment, the light emitting layer EML may be provided in pattern shape corresponding to the opening PDL-OP by using a mask. However, the embodiment of the invention is not limited thereto. In one alternative embodiment, for example, each of the hole transport layer HTL and the electron transport layer ETL may be provided in pattern shape corresponding to the opening PDL-OP by using the mask in a same manner as the light emitting layer EML.

A cathode CE is disposed on the electron transport layer ECL. The upper insulation layer TFE is disposed on the cathode CE. The upper insulation layer TFE may be a thin-film encapsulation layer for encapsulating the display element layer EL. The upper insulation layer TFE may include a plurality of thin-films. The plurality of thin-films may include an inorganic layer and an organic layer. The upper insulation layer TFE may include an insulation layer for encapsulating the display element layer EL and a plurality of insulation layers for improving a light emitting efficiency.

Figure 8:
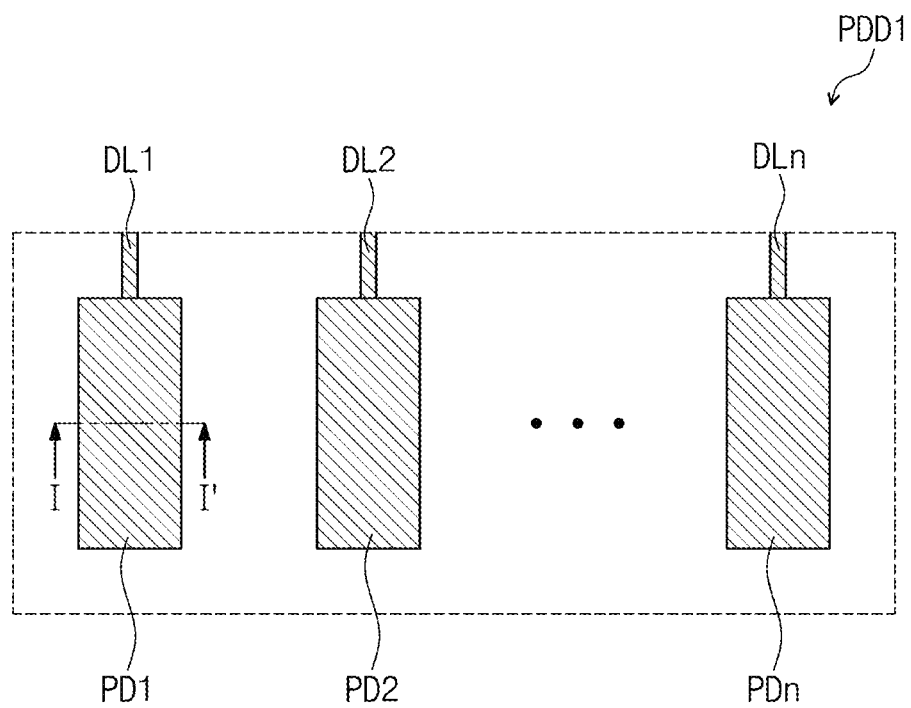
FIG. 8 is an enlarged view illustrating a portion of display pads in FIG. 6.
Figure 9:
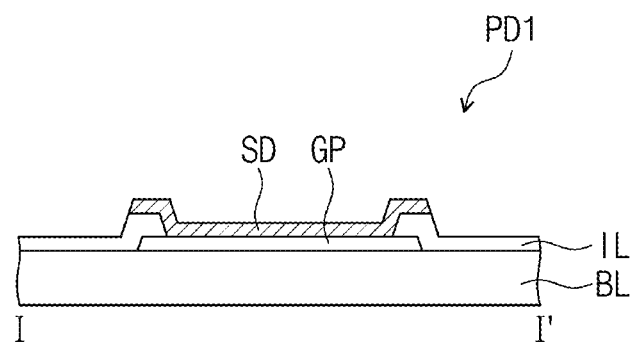
FIG. 9 is a cross-sectional view taken along line I-I' of FIG. 8.

FIG. 8 is an enlarged view illustrating a portion of the display pads in FIG. 6. FIG. 9 is a cross-sectional view taken along line I-I' of FIG. 8. In FIG. 8, a portion of the first pad PDD1 of the display pads in FIG. 6 is enlarged.

Referring to FIGS. 8 and 9, in an embodiment, the first pad PDD1 may include a plurality of sub-pads PD1 to PDn, the sub-pads may be connected to a plurality of data lines DL1 to DLn, respectively. Each of the plurality of sub-pads PD1 to PDn may include a pad part disposed on the base layer BL. Cross-sectional features of the first sub-pad PD1 of the plurality of sub-pads PD1 to PDn illustrated in FIG. 9 are merely exemplary, and other sub-pads may have substantially same cross-sectional features as those shown in FIG. 9.

The first sub-pad PD1 may include a first pad part GP disposed on the base layer BL and a second pad part SD disposed on the first pad part GP. In an embodiment, at least a portion of an outer portion of the first pad GP may be covered by an insulation layer IL, and the second pad part SD may cover at least a portion of the insulation layer IL. Each of the first pad part GP and the second pad part SD may include a metal layer. The first pad part GP may include molybdenum (Mo). The second pad part SD may include aluminum (Al). The second pad part SD may include a first metal layer, and the first metal layer may have triple layers in which titanium (Ti)/aluminium (Al)/titanium (Ti) are sequentially laminated.

Figure 10A:
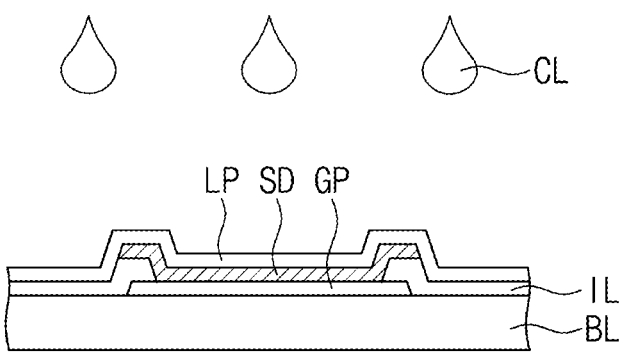
FIGS. 10A and 10B are cross-sectional views sequentially illustrating processes of a method of manufacturing the display device according to an embodiment of the invention.
Figure 10B:
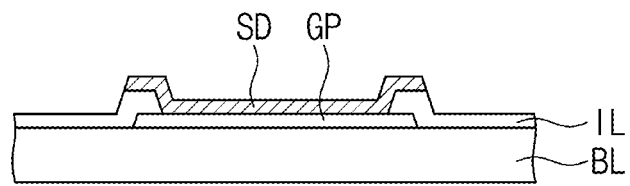

FIGS. 10A and 10B are cross-sectional views sequentially illustrating processes of a method of manufacturing the display device according to an embodiment of the invention. FIGS. 10A and 10B illustrate an etching process performed by the substrate processing apparatus according to an embodiment in a cross-section corresponding to the cutting line I-I' in FIG. 9B in a simplified manner.

An embodiment of the method of manufacturing the display panel includes a process of providing an electrode part on the pad part and a process of etching the electrode part after a process of providing the pad part.

Referring to FIGS. 10A and 10B, the first pad part GP, the insulation layer IL, and the second pad part SD are provided or formed on the base layer in a formation area of the first pad PDD1 (refer to FIG. 8) by being sequentially patterned, and then an electrode part LP may be provided or formed to cover the first pad part GP, the insulation layer IL, and the second pad part SD. In an embodiment, the electrode part LP may be formed through a same deposition process as the anode AE (refer to FIG. 7) contained in the display element EE (refer to FIG. 7). In an embodiment, the first pad part GP may include or be made of molybdenum (Mo), and the second pad part SD may include or be made of aluminum (Al). The second pad part SD may include a first metal layer containing aluminum (Al).

The electrode part LP may include or be made of silver (Ag). The electrode part LP may include a second metal layer containing silver (Ag). In an embodiment, the electrode part LP may include a first metal oxide layer, a second metal layer, and a second metal oxide layer, which are sequentially laminated. The electrode part LP may include a first indium tin oxide ("ITO") layer, a silver (Ag) metal layer, and a second ITO layer, which are sequentially laminated.

The electrode part LP may be etched by an etchant contained in the chemical CL. The process of etching the electrode part LP may be performed by an embodiment of the substrate processing apparatus SPA described above (refer to FIG. 1). In an embodiment, as described above, as a plurality of substrate processing processes are performed by the first to third process chambers ET1, ET2, and ET3 contained in the substrate processing apparatus SPA, the electrode part LP formed on the first pad part GP and the second pad part SD may be etched.

An embodiment of the method of manufacturing the display panel includes a process of etching the electrode part after the electrode part including second metal such as silver is formed on the pad part including first metal such as aluminum. In the process of etching the electrode part, the second metal contained in the electrode part may be oxidized to generate a second metal ion in the etchant. The second metal ion may cause a damage of the pad part by oxidizing the first metal contained in the pad part during an etching process and a subsequent process, and reduced second metal particles or the like may generate a defect such as short-circuit between lines in the subsequent process. In an embodiment of the method of manufacturing the display panel according to the invention, the process of etching the electrode part may be performed by the substrate processing apparatus including the plurality of process chambers, and the second metal ion may maintain a low concentration in the latter process chamber in which a further subsequent process is performed to prevent the metal layers of the pad part disposed below the electrode part from being oxidized or damaged or prevent the short-circuit between the lines from occurring as the second metal particles are reduced and precipitated.

Figure 11A:
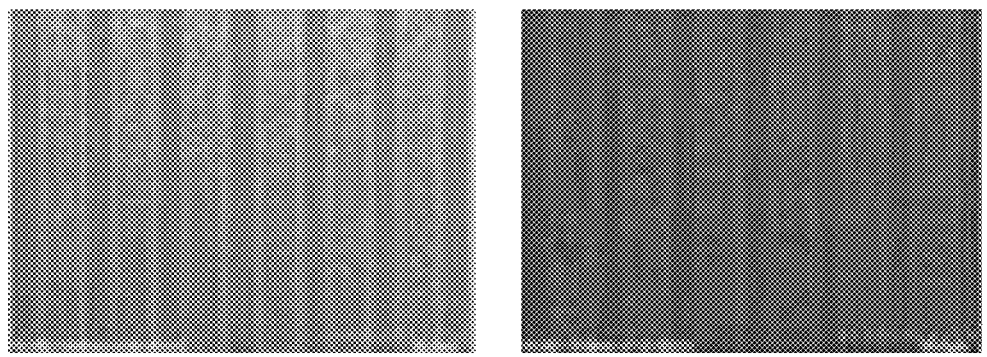
FIG. 11A is a microscopic image of a pad part provided by using the substrate processing apparatus according to an embodiment of the invention.
Figure 11B:
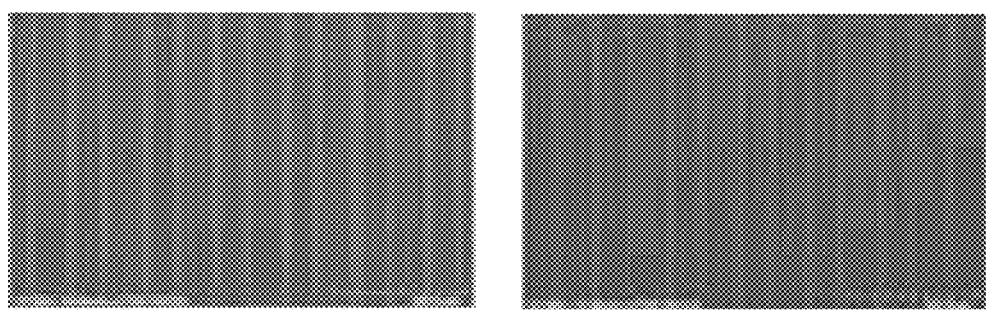
FIG. 11B is a microscopic image of a pad part provided by using a substrate processing apparatus according to a comparative example.

FIG. 11A is a microscopic image of the pad part provided by using the substrate processing apparatus according to an embodiment of the invention. FIG. 11B is a microscopic image of the pad part provided by using the substrate processing apparatus according to a comparative example.

FIG. 11A is the microscopic image of the pad part provided by using the substrate processing apparatus in which three process chambers are connected to the corresponding tanks, respectively, and the latter process chamber has a metal ion concentration less than that of the former process chamber according to an embodiment of the invention. FIG. 11B is the microscopic image of the pad part provided by using the substrate processing apparatus in which three process chambers are connected to the same tank, and the latter process chamber and the former process chamber have the same or similar metal ion concentration.

As illustrated in FIGS. 11A and 11B, when the pad part is provided through the substrate processing apparatus of the comparative example, two hundreds or more metal particles per each pad part may be reduced and precipitated to cause a defect such as short-circuit between the metal layers of the pad part. However, in case of using an embodiment of the substrate processing apparatus according to the invention, metal particles may not be generated in the pad part, or ten or less metal particles may be generated to prevent the defect such as the short-circuit between the metal layers of the pad part from being generated, thereby increasing reliability of the display panel.

According to embodiments of the invention, as the accumulated process number of the etchant provided to the substrate processing apparatus increases, the exchange period of the etchant may be extended to reduce the process costs, and the defect generated by the metal particles reduced and precipitated in the display panel that is the target substrate may be effectively prevented.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A substrate processing apparatus comprising:
   a first process chamber in which a target substrate is processed;
   a first tank connected to the first process chamber to supply a first chemical to the first process chamber;
   a second process chamber in which the target substrate is processed; and
   a second tank connected to the second process chamber to supply a second chemical to the second process chamber,
   wherein a metal ion contained in the first chemical supplied to the first process chamber has an ion concentration greater than an ion concentration of the metal ion contained in the second chemical supplied to the second process chamber.

2. The substrate processing apparatus of claim 1, further comprising:
   a transfer part which transfers the target substrate,
   wherein the target substrate is transferred in a direction from the first process chamber to the second process chamber by the transfer part.

3. The substrate processing apparatus of claim 1, further comprising:
   a third process chamber in which the target substrate is processed; and
   a third tank connected to the third process chamber to supply a third chemical to the third process chamber,
   wherein the metal ion contained in the third chemical supplied to the third process chamber has an ion concentration less than the ion concentration of the metal ion contained in the second chemical supplied to the second process chamber.

4. The substrate processing apparatus of claim 3, wherein the target substrate is processed in the first process chamber and then transferred to the second process chamber, and processed in the second process chamber and then transferred to the third process chamber.

5. The substrate processing apparatus of claim 3, further comprising:
   a concentration meter connected to the third tank to measure the metal ion concentration of the third chemical contained in the third tank.

6. The substrate processing apparatus of claim 3, wherein the third chemical does not comprise the metal ion.

7. The substrate processing apparatus of claim 3, further comprising:
   a standby tank which supplies a new chemical to each of the first tank, the second tank, and the third tank.

8. The substrate processing apparatus of claim 7, wherein the new chemical does not comprise the metal ion.

9. The substrate processing apparatus of claim 3, further comprising:
   a drain pipe connected to each of the first tank, the second tank, and the third tank to transfer the first to third chemicals from the first tank, the second tank, and the third tank, respectively.

10. The substrate processing apparatus of claim 9, wherein the drain pipe comprises:
    a first drain pipe which transfers the third chemical from the third tank to the second tank;
    a second drain pipe which transfers the second chemical from the second tank to the first tank; and
    a third drain pipe which discharges the first chemical from the first tank.

11. The substrate processing apparatus of claim 1, wherein each of the first chemical and the second chemical comprises an etchant for etching a metal part in the target substrate.

12. The substrate processing apparatus of claim 11, wherein
    the metal part comprises a first metal oxide layer, a metal layer, and a second metal oxide layer, which are sequentially laminated one on another, and
    the metal layer comprises silver (Ag).

13. The substrate processing apparatus of claim 1, wherein the metal ion contained in each of the first chemical and the second chemical is a silver (Ag) ion.

14. The substrate processing apparatus of claim 1, further comprising:
    a first supply pipe which supplies the first chemical from the first tank to the first process chamber;
    a first discharge pipe which discharges the first chemical to the first tank after the target substrate is processed in the first process chamber;
    a second supply pipe which supplies the second chemical from the second tank to the second process chamber; and
    a second discharge pipe which discharges the second chemical to the second tank after the target substrate is processed in the second process chamber.

15. The substrate processing apparatus of claim 1, wherein the target substrate is a display panel in a display device.

16. A display panel manufacturing apparatus for providing a plurality of pads in a display panel, the display panel manufacturing apparatus comprising:
    a first process chamber in which the display panel is processed;
    a first tank connected to the first process chamber to supply a first chemical to the first process chamber;
    a second process chamber in which the display panel processed in the first process chamber is further processed; and
    a second tank connected to the second process chamber to supply a second chemical to the second process chamber,
    wherein a metal ion contained in the first chemical supplied to the first process chamber has an ion concentration greater than an ion concentration of an ion contained in the second chemical supplied to the second process chamber.

17. The display panel manufacturing apparatus of claim 16, wherein
    the first process chamber and the second tank are spaced apart from each other, and
    the second process chamber and the first tank are spaced apart from each other.

18. A method of manufacturing a display panel, the method comprising:
    preparing a pad part comprising a first metal layer;
    providing an electrode part comprising a second metal layer on the pad part; and
    etching the electrode part,
    wherein the etching the electrode part comprises:
        etching the electrode part in a first process chamber by using a first chemical;
        etching the electrode part in a second process chamber by using a second chemical after the etching the electrode part in the first process chamber; and etching the electrode part in a third process chamber by using a third chemical after the etching the electrode part in the second process chamber, wherein a metal ion contained in the second chemical has an ion concentration less than an ion concentration of the metal ion contained in the first chemical, and the metal ion contained in the third chemical has a metal ion concentration less than the ion concentration of the metal ion contained in the second chemical.

19. The method of claim 18, wherein the first metal layer comprises aluminum (Al), and the second metal layer comprises silver (Ag).

20. The method of claim 18, wherein the metal ion contained in the first to third chemicals is a silver (Ag) ion.

\* \* \* \* \*